US007696773B2

(12) United States Patent
Levey

(10) Patent No.: US 7,696,773 B2
(45) **Date of Patent: *Apr. 13, 2010**

(54) COMPENSATION SCHEME FOR MULTI-COLOR ELECTROLUMINESCENT DISPLAY

(75) Inventor: Charles I. Levey, West Henrietta, NY (US)

(73) Assignee: Global OLED Technology LLC, Wilmington, DE (US)

( * ) Notice: Subject to any disclaimer, the term of this patent is extended or adjusted under 35 U.S.C. 154(b) by 14 days.

This patent is subject to a terminal disclaimer.

(21) Appl. No.: 12/128,720

(22) Filed: May 29, 2008

(65) Prior Publication Data

US 2009/0295423 A1 Dec. 3, 2009

(51) Int. Cl.
*G01R 31/00* (2006.01)

(52) U.S. Cl. ...................................................... 324/770

(58) Field of Classification Search .............. 324/158.1, 324/770; 345/30–11

See application file for complete search history.

(56) References Cited

U.S. PATENT DOCUMENTS 5,576,730 A * 11/1996 Shimada et al. ............... 345/98
6,359,398 B1 3/2002 Nakajima et al.
6,369,851 B1 4/2002 Marflak et al.
6,433,488 B1 8/2002 Blu
6,791,350 B2 * 9/2004 Taguchi ...................... 324/770
6,856,328 B2 2/2005 Holtslag
6,995,519 B2 2/2006 Arnold et al.
7,038,668 B2 5/2006 Kota et al.
7,388,397 B2 * 6/2008 Tomita ....................... 324/770
7,486,100 B2 * 2/2009 Sakaguchi et al. .......... 324/770
2004/0100430 A1 5/2004 Fruehauf
2005/0180083 A1 8/2005 Takahara et al.
2005/0204313 A1 9/2005 Enoki et al.
2005/0269959 A1 12/2005 Uchino et al.

(Continued)

FOREIGN PATENT DOCUMENTS

JP 2005-037843 10/2005

(Continued)

OTHER PUBLICATIONS

Jahinuzzaman et al, Threshold voltage instability of amorphous silicon thin-film transistors under constant current stress, Applied Physics Letters 87, 023502 (2005).

*Primary Examiner*—Ha Nguyen
*Assistant Examiner*—Joshua Benitez
(74) *Attorney, Agent, or Firm*—Morgan Lewis & Bockius LLP

(57) ABSTRACT

A method of determining characteristics of transistors and electroluminescent devices, includes: providing an electroluminescent display; providing for pairs of electroluminescent devices drive circuits and a single readout line, each drive circuit including a readout transistor electrically connected to the readout line; providing a first voltage source; providing a second voltage source; providing a current source; providing a current sink; providing a test voltage source; providing a voltage measurement circuit; sequentially testing the drive transistors to provide a first signal representative of characteristics of the drive transistor of the first drive circuit and a second signal representative of characteristics of the drive transistor of the second drive circuit, whereby the characteristics of each drive transistor are determined; and simultaneously testing the first and second electroluminescent devices to provide a third signal representative of characteristics of the pair of electroluminescent devices, whereby the characteristics of both electroluminescent devices are determined.

21 Claims, 5 Drawing Sheets

U.S. PATENT DOCUMENTS

2007/0195020 A1 8/2007 Nathan et al.
2008/0122759 A1 * 5/2008 Levey .......................... 345/78
2008/0122760 A1 * 5/2008 Levey et al. .................. 345/78
2008/0315788 A1 * 12/2008 Levey et al. ................ 315/291
2009/0135114 A1 * 5/2009 White et al. .................. 345/78
2009/0167644 A1 * 7/2009 White et al. .................. 345/76

FOREIGN PATENT DOCUMENTS

WO WO 2005/109389 A1 11/2005

* cited by examiner

COMPENSATION SCHEME FOR MULTI-COLOR ELECTROLUMINESCENT DISPLAY

CROSS REFERENCE TO RELATED APPLICATIONS

Reference is made to commonly assigned U.S. patent application Ser. No. 11/766,823 filed Jun. 22, 2007, entitled "OLED Display with Aging and Efficiency Compensation" by Levey et al.; U.S. patent application Ser. No. 11/946,392 filed Nov. 28, 2007, entitled "Electroluminescent Display with Interleaved 3T1C" by White et al.; and U.S. patent application Ser. No. 12/128,697 filed concurrently herewith entitled "Compensation Scheme for Multi-Color Electroluminescent Display" by Levey et al the disclosures of which are incorporated herein by reference.

FIELD OF THE INVENTION

The present invention relates to solid-state electroluminescent flat-panel displays and more particularly to such displays having ways to compensate for the aging of the organic light emitting display components.

BACKGROUND OF THE INVENTION

Electroluminescent (EL) devices are a promising technology for flat-panel displays. For example, Organic Light Emitting Diodes (OLEDs) have been known for some years and have been recently used in commercial display devices. EL devices use thin-film layers of materials coated upon a substrate that emit light when electric current is passed through them. In OLED devices, one or more of those layers includes organic material. Using active-matrix control schemes, a plurality of EL light-emitting devices can be assembled into an EL display. EL pixels, each including an EL device and a drive circuit, are typically arranged in two-dimensional arrays with a row and a column address for each pixel, and are driven by a data value associated with each pixel to emit light at a brightness corresponding to the associated data value. To make a full-color display, one or more pixels of different colors are grouped together, e.g. red, green, and blue. The collection of all the pixels of a particular color is commonly called a "color plane." A monochrome display can be considered to be a special case of a color display having only one color plane.

Typical large-format displays (e.g. having a diagonal of greater than 12 to 20 inches) employ hydrogenated amorphous silicon thin-film transistors (a-Si TFTs) formed on a substrate to drive the pixels in such large-format displays. Amorphous Si backplanes are inexpensive and easy to manufacture. However, as described in "Threshold Voltage Instability Of Amorphous Silicon Thin-Film Transistors Under Constant Current Stress" by Jahinuzzaman et al. in Applied Physics Letters 87, 023502 (2005), the a-Si TFTs exhibit a metastable shift in threshold voltage ($V_{th}$) when subjected to prolonged gate bias. This shift is not significant in traditional display devices such as LCDs, because the magnitude of current required to switch the liquid crystals in LCD display is relatively small. However, for LED applications, much larger currents must be switched by the a-Si TFT circuits to drive the EL materials to emit light. Thus, EL displays employing a-Si TFT circuits generally exhibit a significant $V_{th}$ shift as they are used. This $V_{th}$ shift can result in decreased dynamic range and image artifacts. Moreover, the organic materials in OLED and hybrid EL devices also deteriorate in relation to the integrated current density passed through them over time, so that their efficiency drops while their resistance to current, and thus forward voltage, increases. These effects are described in the art as "aging" effects.

These two factors, TFT and EL aging, reduce the lifetime of the display. Different organic materials on a display can age at different rates, causing differential color aging and a display whose white point varies as the display is used. If some EL devices in the display are used more than others, spatially differentiated aging can result, causing portions of the display to be dimmer than other portions when driven with a similar signal. This can result in visible burn-in. For example, this occurs when the screen displays a single graphic element in one location for a long period time. Such graphic elements can include stripes or rectangles with background information, e.g. news headlines, sports scores, and network logos. Differences in signal format are also problematic. For example, displaying a widescreen (16:9 aspect ratio) image letterboxed on a conventional screen (4:3 aspect ratio) requires the display to matte the image, causing the 16:9 image to appear on a middle horizontal region of the display screen and black (non-illuminated) bars to appear on the respective top and bottom horizontal regions of the 4:3 display screen. This produces sharp transitions between the 16:9 image area and the non-illuminated (matte) areas. These transitions can burn in over time and become visible as horizontal edges. Furthermore, the matte areas are not aged as quickly as the image area in these cases, which can result in the matte areas' being objectionably brighter than the 16:9 image area when a 4:3 (full-screen) image is displayed.

One approach to avoiding the problem of voltage threshold shift in TFT circuits is to employ circuit designs whose performance is relatively constant in the presence of such voltage shifts. For example, U.S. Patent Application Publication No. 2005/0269959 by Uchino et al, describes a pixel circuit having a function of compensating for characteristic variation of an electro-optical element and threshold voltage variation of a transistor. The pixel circuit includes an electro-optical element, a holding capacitor, and five-channel thin-film transistors. Alternative circuit designs employ current-mirror driving circuits that reduce susceptibility to transistor performance. For example, U.S. Patent Application Publication No. 2005/0180083 by Takahara et al. describes such a circuit. However, such circuits are typically much larger and more complex than the two-transistor, single capacitor (2T1C) circuits otherwise employed, thereby reducing the aperture ratio (AR), the percent of the area on a display available for emitting light. The decrease in AR decreases the display lifetime by increasing the current density through each EL device.

Other methods used with a-Si TFTs rely upon measuring the threshold-voltage shift. For example, U.S. Patent Application Publication No. 2004/0100430A1 by Fruehauf describes an OLED pixel circuit including a conventional 2T1C pixel circuit and a third transistor used to carry a current to an off-panel current measurement circuit. As Vth shifts and the OLED ages, the current decreases. This decrease in current is measured and used to adjust the data value used to drive the pixel. Similarly, U.S. Pat. No. 6,433,488 B1 by Bu, describes using a third transistor to measure the current flowing through an OLED device under a test condition and comparing that current to a reference current to adjust the data value. Additionally, Arnold et al., in commonly-assigned U.S. Pat. No. 6,995,519, teach using a third transistor to produce a feedback signal representing the voltage across the OLED, permitting compensation of OLED aging but not Vth shift. However, although these schemes do not require as many transistors as pixel circuits with internal compensation, they do require additional signal lines on a display backplane to carry the measurements. These additional signal lines reduce aperture ratio and add assembly cost. For example, these schemes can require one additional data line per column. This doubles the number of lines that have to be bonded to driver integrated circuits, increasing the cost of an assembled display, and increasing the probability of bond failure, thus decreasing the yield of good displays from the assembly line. This problem is particularly acute for large-format, high-resolution displays, which can have over two thousand columns. However, it also affects smaller displays, as higher bondout counts can require higher-density connections, which are more expensive to manufacture and have lower yield than lower-density connections.

Alternative schemes for reducing image burn-in have been addressed for televisions using a cathode ray tube display. U.S. Pat. No. 6,359,398, describes methods and apparatus that are provided for equally aging a cathode ray tube (CRT). Under this scheme, when displaying an image of one aspect ratio on a display of a different aspect ratio, the matte areas of the display are driven with an equalization video signal. In this manner, the CRT is uniformly aged. However, the solution proposed requires the use of a blocking structure such as doors or covers that can be manually or automatically provided to shield the matte areas from view when the equalization video signal is applied to the otherwise non-illuminated region of the display. This solution is unlikely to be acceptable to most viewers because of the cost and inconvenience. U.S. Pat. No. 6,359,398 also discloses that matte areas can be illuminated with gray video having luminance intensity matched to an estimate of the average luminous intensity of the program video displayed in the primary region. As indicated therein, however, such estimation is not perfect, resulting in a reduced, but still present, non-uniform aging.

U.S. Pat. No. 6,369,851 describes a method and apparatus for displaying a video signal using an edge modification signal to reduce spatial frequency and minimize edge burn lines, or a border modification signal to increase brightness of image content in a border area of a displayed image, where the border area corresponds to a non-image area when displaying images with a different aspect ratio. However, these solutions can cause objectionable image artifacts, for example reduced sharpness or visibly brighter border areas in displayed images.

The general problem of regional brightness differences due to burn-in of specific areas due to video content has been addressed in the prior art, for example by U.S. Pat. No. 6,856,328. This disclosure teaches that the burn-in of graphic elements as described above can be prevented by detecting those elements in the corners of the image and reducing their intensity to the average display load. This method requires the detection of static areas and cannot prevent color-differentiated burn-in. An alternative technique is described in Japanese Publication No. 2005-037843 A by Igarashi et al. entitled "Camera and Display Control Device". In this disclosure, a digital camera is provided with an organic EL display that is prevented from burning in by employing a DSP in the digital camera. The DSP changes the position of an icon on the organic EL display by changing the position of the icon image data in a memory every time that the camera is turned on. Since the degree to which the display position is changed is approximately one pixel, a user cannot recognize the change in the display position. However, this approach requires a prior knowledge and control of the image signal and does not address the problem of format differences.

U.S. Patent Application Publication No. 2005/0204313 A1 by Enoki et al. describes a further method for display screen burn prevention, wherein an image is gradually moved in an oblique direction in a specified display mode. This and similar techniques are generally called "pixel orbiter" techniques. Enoki et al. teach moving the image as long as it displays a still image, or at predetermined intervals. Kota et al., in U.S. Pat. No. 7,038,668, teach displaying the image in a different position for each of a predetermined number of frames. Similarly, commercial plasma television products advertise pixel orbiter operational modes that sequentially shift the image three pixels in four directions according to a user-adjustable timer. However, these techniques cannot employ all pixels of a display, and therefore can create a border effect of pixels that are brighter than those pixels in the image area that are always used to display image data.

Existing methods for mitigating image burn-in on EL displays generally either require additional display circuitry or manipulate the displayed image. Methods requiring additional display circuitry can reduce the lifetime of the display, increase its cost, and reduce manufacturing yield. Methods manipulating the displayed image cannot correct for all burn-in. Accordingly, there is a need for an improved method and apparatus for providing improved display uniformity in electroluminescent flat-panel display devices.

SUMMARY OF THE INVENTION

It is therefore an object of the present invention to compensate for aging and efficiency changes in electroluminescent emitters in the presence of transistor aging.

This object is achieved by a method of determining characteristics of transistors and electroluminescent devices in an electroluminescent display, comprising:

(a) providing an electroluminescent display having a two-dimensional array of electroluminescent devices arranged in rows and columns, wherein each electroluminescent device is driven by a drive circuit in response to a drive signal;

(b) providing for pairs of electroluminescent devices a first drive circuit associated with the first electroluminescent device, a second drive circuit associated with the second electroluminescent device, and a single readout line, each drive circuit including a drive transistor having first, second, and gate electrodes, and a readout transistor having first, second, and gate electrodes, with each readout transistor of a pair being electrically connected to the readout line;

(c) providing a first voltage source and a first switch for selectively connecting the first voltage source to the first electrodes of the drive transistors;

(d) providing a second voltage source and a second switch for selectively connecting the electroluminescent devices to the second voltage source;

(e) providing a current source and a third switch for selectively connecting the current source to the second electrode of the readout transistors;

(f) providing a current sink and a fourth switch for selectively connecting the current sink to the second electrode of the readout transistors;

(g) providing a test voltage source for turning the drive transistors on and off by applying potential to the gate electrodes of the drive transistors;

(h) providing a voltage measurement circuit connected to the second electrode of the readout transistors;

(i) sequentially testing the drive transistors of the first and second drive circuits by closing the first and fourth switches, opening the second and third switches, using the test voltage source to turn on the drive transistor of the first drive circuit and turn off the drive transistor of the second drive circuit, drawing a test current using the current sink, using the voltage measurement circuit to measure the voltage at the second electrode of the readout transistor of the first drive circuit to provide a first signal representative of characteristics of the drive transistor of the first drive circuit, using the test voltage source to turn off the drive transistor of the first drive circuit and turn on the drive transistor of the second drive circuit, and using the voltage measurement circuit to measure the voltage at the second electrode of the readout transistor of the second drive circuit to provide a second signal representative of characteristics of the drive transistor of the second drive circuit, whereby the characteristics of each drive transistor are determined; and (j) simultaneously testing the first and second electroluminescent devices by opening the first and fourth switches, and closing the second and third switches, using the test voltage source to turn off both of the drive transistors, driving a test current using the current source, and using the voltage measurement circuit to measure the voltage at the second electrode of the readout transistors to provide a third signal representative of characteristics of the pair of electroluminescent devices, whereby the characteristics of both electroluminescent devices are determined.

An advantage of this invention is an electroluminescent (EL) display that compensates for the aging of the organic materials in the display wherein circuitry aging is also occurring, without requiring extensive or complex circuitry for accumulating a continuous measurement of light-emitting element use or time of operation. It is a further advantage of this invention that it uses simple voltage measurement circuitry. It is a further advantage of this invention that by making all measurements of voltage, it is more sensitive to changes than methods that measure current. It is a further advantage of this invention that it performs the compensation based separately on EL changes and changes in driving transistor properties. It is a further advantage of this invention that compensation for changes in driving transistor properties can be performed with compensation for the EL changes, thus providing a complete compensation solution. It is a further advantage of this invention that both aspects of measurement and compensation (EL and driving transistor) can be accomplished rapidly. It is a further advantage of this invention that characterization and compensation of driving transistor and EL changes are unique to the specific element and are not impacted by other elements that can be open-circuited or short-circuited.

DETAILED DESCRIPTION OF THE INVENTION

Figure 1:
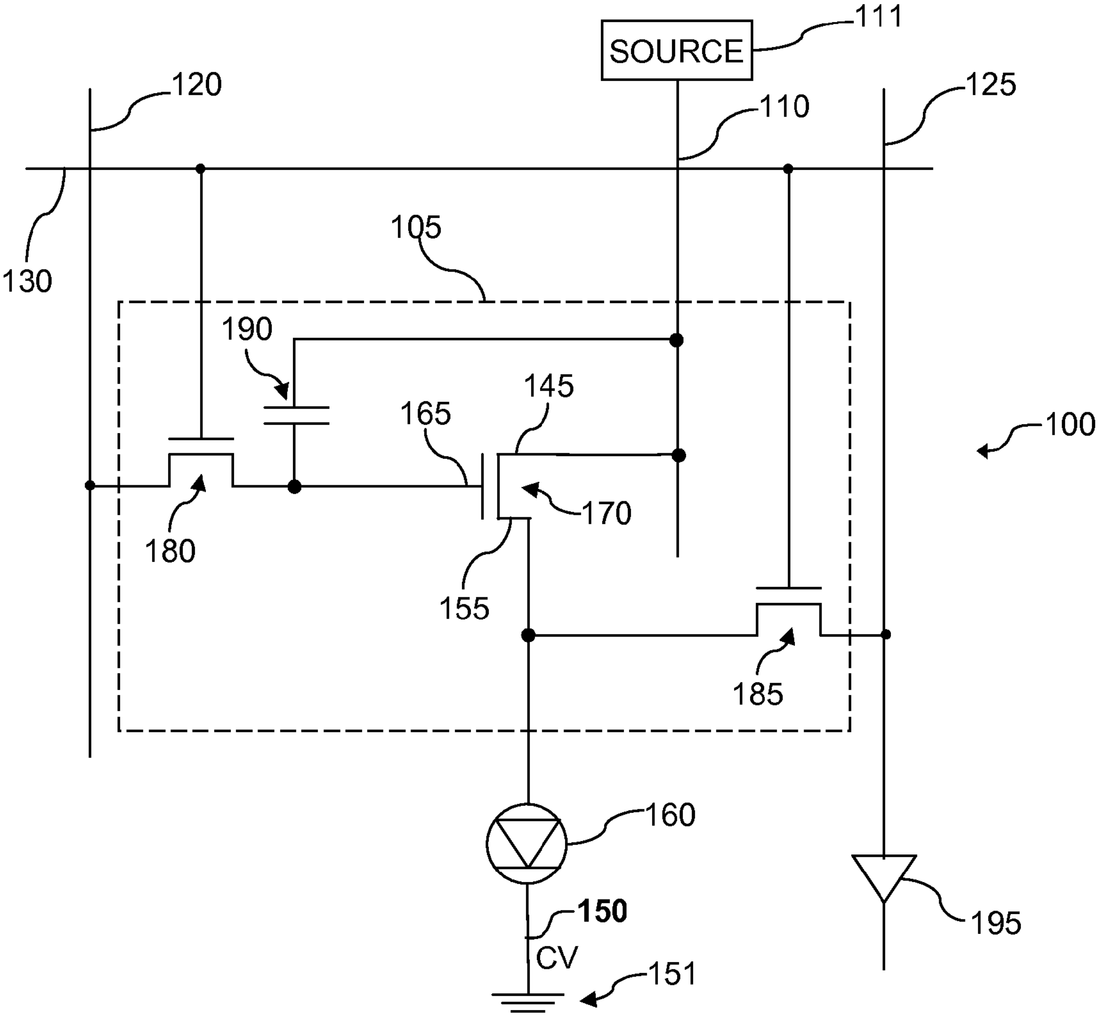
FIG. 1 is a schematic diagram of an electroluminescent pixel which can be useful in the present invention.

Turning now to FIG. 1, there is shown a schematic diagram of an electroluminescent (EL) pixel as described by Levey et al. in above-cited commonly assigned U.S. patent application Ser. No. 11/766,823. Such pixels are well known in the art in active matrix EL displays. One useful example of an EL display is an organic light-emitting diode (OLED) display. EL pixel 100 includes a light-emitting EL device 160 and a drive circuit 105. EL pixel 100 is connected to a data line 120, a first power supply line 110 driven by a first voltage source 111, a select line 130, and a second power supply line 150 driven by a second voltage source 151. By "connected" or "electrically connected" it is meant that the elements are directly connected or connected via another component, e.g. a switch, a diode, another transistor, etc. Drive circuit 105 includes a drive transistor 170, a switch transistor 180, and a capacitor 190. Drive transistor 170 can be an amorphous-silicon (a-Si) thin-film transistor. It has first electrode 145, a second electrode 155, and a gate electrode 165. First electrode 145 of drive transistor 170 is connected to first power supply line 110, while second electrode 155 is connected to EL device 160. In this embodiment of drive circuit 105, first electrode 145 of drive transistor 170 is a drain electrode and second electrode 155 is a source electrode, and drive transistor 170 is an n-channel device. EL device 160 is a non-inverted EL device that is connected to drive transistor 170 and to second voltage source 151 via second power supply line 150. In this embodiment, the second voltage source 151 is ground. Those skilled in the art will recognize that other embodiments can use other sources as the second voltage source. A switch transistor 180 has a gate electrode connected to select line 130, as well as source and drain electrodes, one of which is connected to a gate electrode 165 of drive transistor 170, and the other of which is connected to data line 120.

EL device 160 is powered by flow of current between first power supply line 110 and second power supply line 150. In this embodiment, the first voltage source 111 has a positive potential relative to the second voltage source 151, to cause current to flow through drive transistor 170 and EL device 160, so that EL device 160 produces light. The magnitude of the current—and therefore the intensity of the emitted light—is controlled by drive transistor 170, and more specifically by the magnitude of the signal voltage on gate electrode 165 of drive transistor 170. During a write cycle, select line 130 activates switch transistor 180 for writing, and the signal voltage data on data line 120 is written to drive transistor 170 and stored on a capacitor 190 that is connected between gate electrode 165 and first power supply line 110.

As discussed above, a-Si transistors such as drive transistor 170, and EL devices such as 160, have aging effects. It is desirable to compensate for such aging effects to maintain consistent brightness and color balance of the display, and to prevent image burn-in. For readout of values useful for such compensation, drive circuit 105 further includes a readout transistor 185, connected to the second electrode 155 of the drive transistor 170 and to readout line 125. The gate electrode of the readout transistor 185 can be connected to the select line 130, or in general to some other readout-selection line. The readout transistor 185, when active, electrically connects second electrode 155 to readout line 125 that carries a signal off the display to electronics 195. Electronics 195 can include, for example, a gain buffer and an A/D converter to read the voltage at electrode 155.

Figure 2:
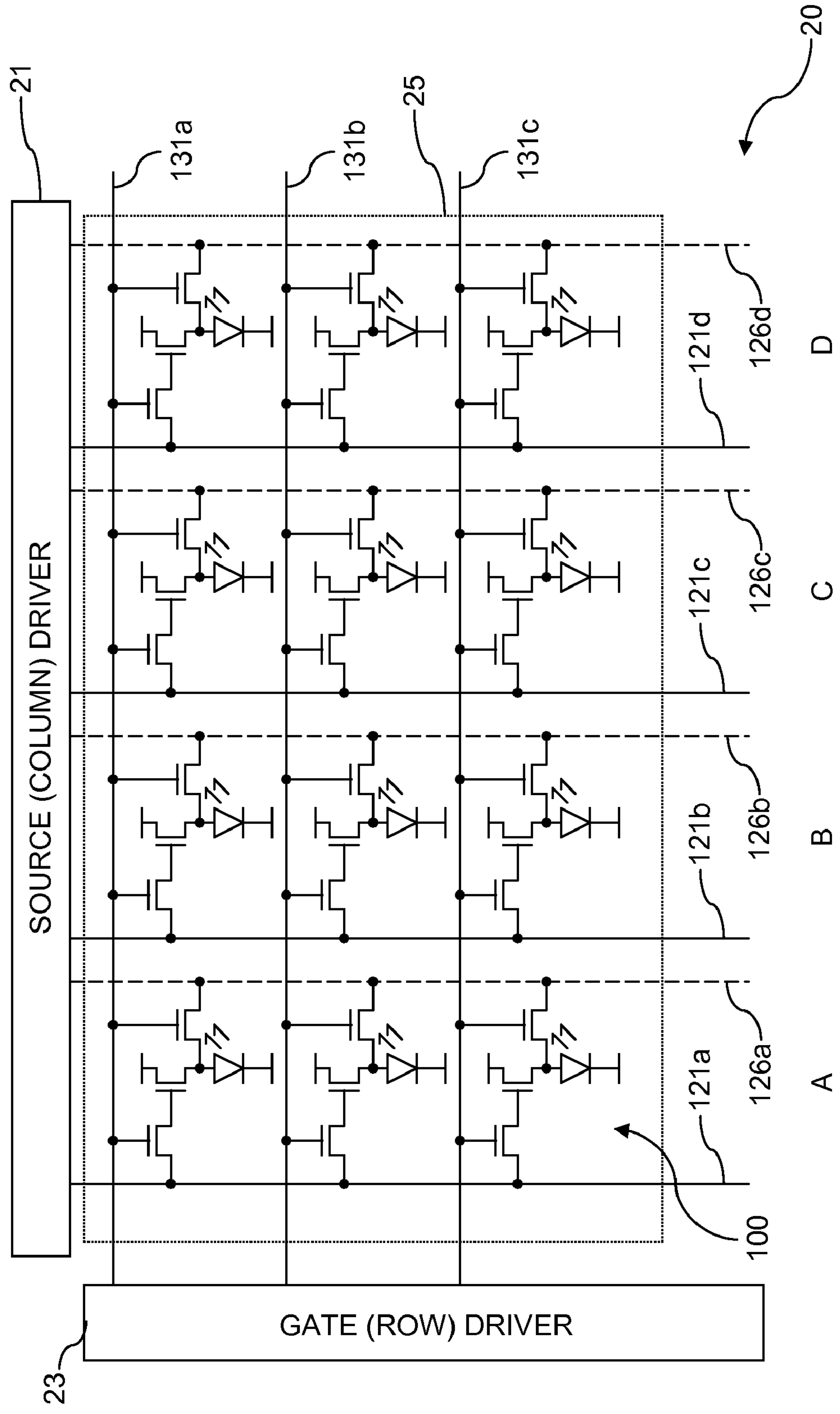
FIG. 2 is a schematic diagram of an EL display which can be useful in the present invention.

Turning now to FIG. 2, there is shown a schematic diagram of an EL display 20 as described by White et al. in above cited commonly assigned U.S. patent application Ser. No. 11/946,392. A display 20 includes a source driver 21, a gate driver 23, and a display matrix 25. The display matrix 25 has a plurality of EL pixels 100 arranged in rows and columns. Each row has a select line (131*a*, 131*b*, 131*c*). Each column has a data line (121*a*, 121*b*, 121*c*, 121*d*) and a readout line (126*a*, 126*b*, 126*c*, 126*d*). Each pixel includes a drive circuit and an EL device, as shown in FIG. 1. Current is driven through each EL device by a drive transistor in its corresponding drive circuit in response to a drive signal carried on its column's data line and applied to the gate electrode of the drive transistor. As EL devices are generally current-driven, driving current through an EL device with a drive circuit is conventionally referred to as driving the EL device. The column of pixel circuits connected to data line 121*a* will hereinafter be referred to as "column A," and likewise for columns B, C, and D, as indicated on the figure. The readout lines 126*a* to 126*d* are shown dashed on FIG. 2 for clarity only, they are electrically continuous along the whole column. The data lines 121*a* to 121*d* and the readout lines 126*a* to 126*d* are all connected to source driver 21, doubling the bond count required for external connection when compared to a simple two-transistor, one-capacitor (2T1C) design. The readout lines can also be connected to a readout circuit not included in the source driver. The terms "row" and "column" do not imply any particular orientation of the EL display. Rows and columns can be interchanged without loss of generality. The readout lines can be oriented in other configurations than parallel to the column lines.

Figure 3:
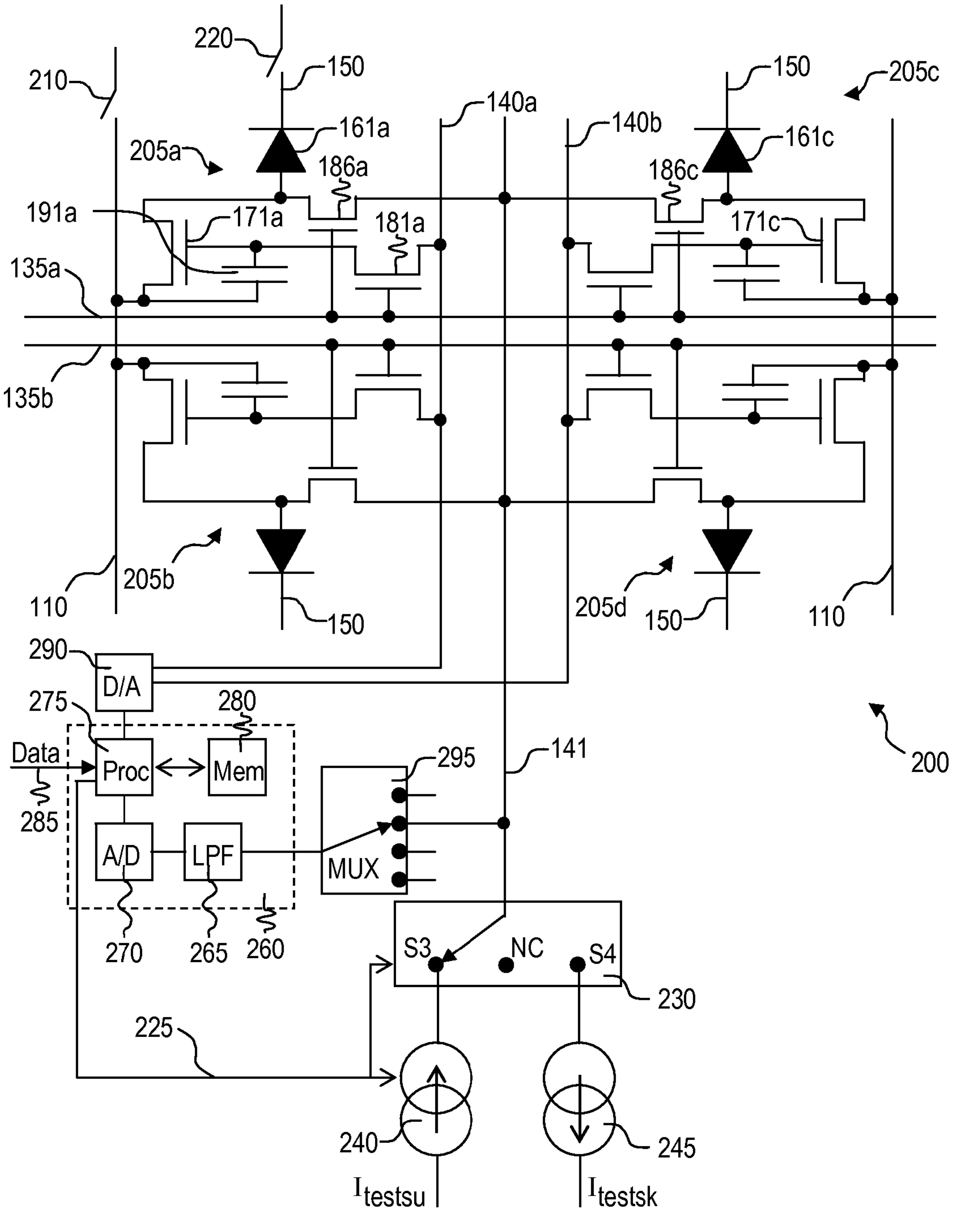
FIG. 3 is a schematic diagram of one embodiment of a pixel drive circuit for an electroluminescent device that can be used in the practice of this invention.

Turning now to FIG. 3, there is shown a schematic diagram of one embodiment of an electroluminescent display including a pixel drive circuit for an electroluminescent device, which can be used in the practice of this invention. Display 200 is an electroluminescent (EL) display that has a two-dimensional array of pixels, e.g. pixels 205*a*, 205*b*, 205*c*, and 205*d*, arranged in rows and columns. This embodiment uses a quad pixel pattern, but other pixel patterns known in the art, such as horizontal or vertical stripe, can be used with the present invention. Each pixel has an electroluminescent (EL) device and a drive circuit in association. For example, pixel 205*a* includes EL device 161*a*, and a drive circuit comprising drive transistor 171*a*, switch transistor 181*a*, capacitor 191*a*, and readout transistor 186*a*, and is connected to first data line 140*a*. The transistors are amorphous-silicon thin-film transistors and have first, second, and gate electrodes as described above. The other pixels have corresponding structures, which are correspondingly numbered. The EL device of each pixel is driven by the corresponding drive transistor of the drive circuit in response to a drive signal, which is conveyed to the gate electrode of the drive transistor from a data line by the corresponding switch transistor. The display includes data lines (e.g. first and second data lines 140*a* and 140*b*) and select lines (e.g. 135*a* and 135*b*) for providing drive signals to the subpixels as well-known in the art. Each column of pixels is provided with a corresponding data line, e.g. first data line 140*a* for pixels 205*a* and 205*b*, and second data line 140*b* for pixels 205*c* and 205*d*, for providing drive signals to the drive transistor to cause the corresponding EL devices to emit light. The first electrode of the drive transistor is connected to first power supply line 110, while the second electrode is connected to the corresponding EL device and to a first electrode of the corresponding readout transistor. The EL device is fit her connected to second power supply line 150. A first electrode of the switch transistor is connected to a data line, and the second electrode is connected to the gate electrode of the drive transistor. The gate electrodes of the switch transistor and the readout transistor are connected to a select line. The light can be colored, e.g. by providing different emitters for different pixels, or can be a single color or broadband-emitting, e.g. white. Each row of pixels is provided with a corresponding select line, e.g. select line 135*a* for the row of pixels 205*a* and 205*c*.

The display further includes first power supply lines 110, which are connected to a common first voltage source as described above, and second power supply lines ISO, which are connected to a common second voltage source as described above. The display also includes first switch 210 and second switch 220 connected to first power supply line 110 and second power supply line 150, respectively. First switch 210 and second switch 220 are desirably located off-panel, and though not shown for the sake of clarity, the switches are connected to all respective power supply lines on the display. At least one first switch 210 and second switch 220 are provided for the OLED display. Additional first and second switches can be provided if the OLED display has multiple powered subgroupings of pixels. First switch 210 selectively connects a first voltage source, via first power supply line 110, to a first electrode of the drive transistors, e.g. drive transistor 171*a*. Second switch 220 selectively connects a second voltage source, via second power supply line 150, to the EL devices, e.g. EL device 161*a*. The display includes readout line 141 and switch block 230. One switch block 230 and a single readout line 141 are provided for every two columns of pixels. The readout line 141 is connected to the second electrode of the readout transistors of the two columns of pixels. Pixels are connected to the readout line in pairs, e.g. readout line 141 is connected to readout transistors 186*a* and 186*c* of the pair of pixels 205*a* and 205*c*. For discussion purposes, one pixel of the pair will herein be referred to as the first pixel, e.g. first pixel 205*a*, while the other pixel of the pair will be referred to as the second pixel, e.g. second pixel 205*c*. Similarly, the various components of the first and second pixels will be referred to as first and second components, respectively. Thus, first pixel 205*a* includes first EL device 161*a* and an associated first drive circuit that includes first drive transistor 171*a* and first readout transistor 186*a*. Further, the components of a pair of pixels will themselves be referred to as pair of components. Thus, pixel pair 205*a* and 205*c* include a pair of EL devices 161*a* and 161*c*, a pair of readout transistors 186*a* and 186*c*, etc. Switch block 230 includes a third switch S3 and a fourth switch S4, and also a no-connect state NC. Switch block 230 selectively connects readout line 141 to current source 240 (selectively via third switch S3) or current sink 245 (selectively via fourth switch S4). In normal display mode, first and second switches 110 and 120 are closed, while other switches (described below) are open; that is, switch block 230 is set to NC. While the third and fourth switches can be individual entities, they are never closed simultaneously in this method, and thus switch block 230 provides a convenient embodiment of the two switches. Switch block 230, current source 240, and current sink 245 can be provided located on or off the EL display substrate.

Each pixel includes a readout transistor. The pixels are arranged in pixel pairs wherein each pixel of the pair shares a readout line and a select line. For example, pixels 205*a* and 205*c* form a pair wherein readout transistor 186*a* and readout transistor 186*c* are electrically connected to readout line 141. The gate electrodes of readout transistors 186*a* and 186*c* are connected together to select line 135*a*. Switch block 230 is used in conjunction with the readout transistors. The third switch S3 permits current source 240 to be selectively connected via readout line 141 to permit a predetermined constant current to flow into the pixels. The fourth switch S4 permits current sink 245 to be selectively connected via second data line 140*b* to permit a predetermined constant current to flow from the pixels when a predetermined data value is applied to an associated data line.

A voltage measurement circuit 260 is further provided connected to readout line 141. Voltage measurement circuit 260 measures voltages to derive a correction signal to adjust the drive signals applied to the drive transistors. Voltage measurement circuit 260 includes at least analog-to-digital converter 270 for converting voltage measurements into digital signals, and a processor 275. The signal from analog-to-digital converter 270 is sent to processor 275. Voltage measurement circuit 260 can also include a memory 280 for storing voltage measurements, and a low-pass filter 265 if necessary. Other embodiments of voltage measurement circuits will be clear to those skilled in the art. Voltage measurement circuit 260 can be connected through multiplexer 295 to a plurality of readout lines 141 for sequentially reading out the voltages from a predetermined number of pixels. Processor 275 can also be connected to data lines (e.g. first data line 140*a* and second data line 140*b*) by way of a digital-to-analog converter 290. Thus, processor 275 can also serve as a test voltage source for applying a predetermined test potential to the data lines, and therefore to the gate electrodes of the drive transistors, during the measurement process to be described herein. In this way, processor 275 can turn the drive transistors on or off to current flow. Processor 275 can also accept display data via data input 285 and provide compensation for changes as will be described herein, thus providing compensated data to the data lines during the display process.

Instead of a voltage measurement circuit, one can use a compensation circuit such as a comparator to compare the voltage on readout line 141 to a known reference. This can provide a lower-cost apparatus than embodiments that include a voltage measurement circuit.

A controller can also be provided for driving the specific color subpixel to provide readout signals. The controller can be processor 275. The controller can open and close any of the first through fourth switches, can set current sink 245 to draw a predetermined test current, and can set current source 240 to drive a predetermined test current. This is shown schematically by a control bus 225. For clarity of illustration, control bus 225 is only shown to switch block 230 and current source 240, but it will be understood that control bus 225 can permit the controller to set any switch, current sink, current source, data lines, select lines, or multiplexer, as required, and can therefore control the process described below.

In normal operation, the display operates as an active-matrix display as well-known in the art. First switch 210 and second switch 220 are closed in normal operation, while third and fourth switches S3 and S4 are open (that is, switch block 230 is set to NC). Data is placed upon data lines (e.g. 140*a*, 140*b*) and an appropriate select line (e.g. 135*a*) is activated to place that data onto the gate electrodes of the corresponding drive transistors to drive the corresponding EL devices at the desired level.

Each pixel of the display has another mode, which will herein be called readout mode. In readout mode, first and second switches 210 and 220 and switch block 230 are manipulated along with the select lines and data placed on the data lines so as to provide measurements representative of characteristics of the drive transistors and the EL devices. Readout mode has three distinct measurements for each pair of pixels. The measurements will be demonstrated for pixels 205*a* and 205*c*, which for this discussion will be termed the first and second pixels, respectively, with associated first and second EL devices, first and second drive circuits, and first and second drive transistors. For the first two measurements, first switch 210 is closed and second switch 220 is opened, and switch block 230 is set to S4 such that fourth switch S4 is closed and third switch S3 is opened. Processor 275, acting as a test voltage source, places a potential on data line 140*a* that will turn on first drive transistor 171*a*, and a potential on data line 140*b* that will turn off second drive transistor 171*c*, and select line 135*a* is activated to write these potentials to the gate electrodes of the respective drive transistors. Current sink 245, which is connected to readout line 141 via fourth switch S4, is set to draw a test current, $I_{testsk}$. Select line 135*a* also activates readout transistors 186*a* and 186*c*, thus permitting current to flow from first power supply line 110 to current sink 245 and permitting readout line 141 to receive a first readout signal from pixels 205*a* and 205*c*. Since second drive transistor 171*c* was turned off, the readout signal will be representative of characteristics of first drive transistor 171*a*, including the threshold voltage of the transistor.

Processor 275 can place a potential on data line 140*a* that will turn off first drive transistor 171*a*, and a potential on data line 140*b* that will turn on second drive transistor 171*c*. Readout line 141 then receives a second readout signal from pixels 205*a* and 205*c* wherein the readout signal will be representative of characteristics of second drive transistor 171*c*.

For the third measurement, first switch 210 is opened and second switch 220 is closed, and switch block 230 is set to S3 such that third switch S3 is closed and fourth switch S4 is opened. Processor 275, acting as a test voltage source, places a potential on data lines 140*a* and 140*b* that will turn off first and second drive transistors 171*a* and 171*c*, and select line 135*a* is activated to write these potentials to the gate electrodes of the drive transistors. Current source 240, which is connected to readout line 141 via third switch S3, is set to drive a test current $I_{testsu}$. Select line 135*a* also activates readout transistors 186*a* and 186*c*, thus permitting current to flow from current source 240 to second power supply line 150 and permitting readout line 141 to receive a third readout signal from pixels 205*a* and 205*c*. Since current can flow through both EL devices 161*a* and 161*c*, the readout signal will be representative of characteristics of both EL devices, including the resistance of the EL devices.

Figure 4:
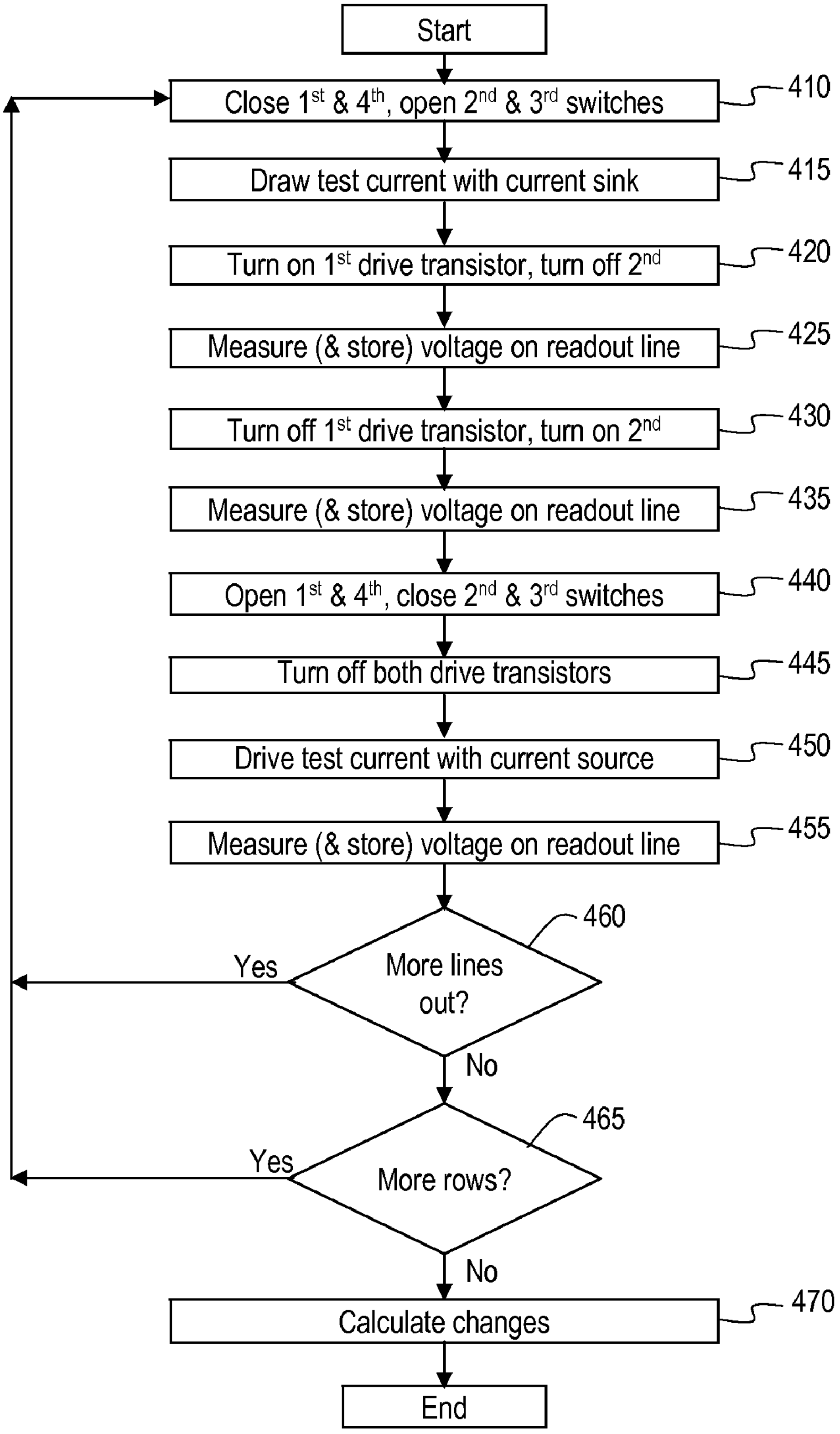
FIG. 4 is a block diagram showing one embodiment of the method of this invention.

Turning now to FIG. 4, and referring also to FIG. 3, there is shown a block diagram of one embodiment of the method of determining characteristics of transistors and EL devices in an EL display, and of compensating for changes in the characteristics, as embodied in the present invention. The method separately and sequentially tests the drive transistor of each pixel of a pair, and simultaneously tests the EL devices of the pair. First switch 210 is closed and second switch 220 is opened. The fourth switch is closed and the third switch is opened, that is, switch block 230 is switched to S4 (Step 410). Current sink 245 is set to draw a predetermined test current (Step 415). Current can potentially flow from first power supply line 110 through readout line 141 and current sink 245 for pixels wherein the drive transistors and readout transistors are activated. The test voltage source, e.g. processor 275, provides a first predetermined test potential ($V_{data}$) to first data line 140*a* and a second predetermined test potential ($V_0$) to second data line 140*b*. These potentials will thus be provided to the gate electrodes of first and second drive transistors 171*a* and 171*c* of the first and second drive circuits, respectively, when select line 135*a* is activated. Select line 135*a* also activates readout transistors 186*a* and 186*c*. First potential $V_{data}$ is selected to be sufficient to cause a current flow through drive transistor 171*a*, while second potential $V_0$ is below the threshold voltage of the transistor, and is desirably zero, so that no current will flow through drive transistor 171*c*. Thus, first drive transistor 171*a* is turned on, while second drive transistor 171*c* is turned off (Step 420). A current thus flows from first power supply line 110 through drive transistor 171*a* and readout line 141 to current sink 245. The value of current ($I_{testsk}$) through current sink 245 is selected to be less than the resulting current would be through drive transistor 171*a* due to the application of $V_{data}$; a typical value will be in the range of 1 to 5 microamps and will be constant for all measurements during the lifetime of the pixel. $V_{data}$ therefore must be sufficient to provide a current through drive-transistor 171*a* greater than that at current sink 245 even after aging expected during the lifetime of the display. The limiting value of current through drive transistor 171*a* will be controlled entirely by current sink 245. The value of $V_{data}$ can be selected based upon known or determined current-voltage and aging characteristics of drive transistor 171*a*. More than one measurement value can be used in this process, e.g. one can choose to do the measurement at 1, 2, and 3 microamps using a value of $V_{data}$ that is sufficient to remain constant for the largest current during the lifetime of the OLED drive circuit. Voltage measurement circuit 260 is used to test drive transistor 171*a* by measuring the voltage on readout line 141, which is the voltage at the second electrode of readout transistor 186*a* of the first drive circuit, providing a first readout signal $V_1$ that is representative of characteristics, including the threshold voltage $V_{th}$, of first drive transistor 171*a* (Step 425).

Processor 275 then provides potential $V_{data}$ to second data line 140*b* and to second drive transistor 171*c*, and provides potential $V_0$ to first data line 140*a* and to first drive transistor 171*a*. Thus, first drive transistor 171*a* is turned off, while second drive transistor 171*c* is turned on (Step 430). Voltage measurement circuit 260 is used to test drive transistor 171*c* by measuring the voltage on readout line 141, which is the voltage at the second electrode of readout transistor 186*c* of the second drive circuit, providing a second readout signal $V_2$ that is representative of characteristics, including the threshold voltage $V_{th}$, of second drive transistor 171*c* (Step 435).

The first and second EL devices are then tested simultaneously. First switch 210 is then opened and second switch 220 is closed. The fourth switch is opened and the third switch is closed, that is, switch block 230 is switched to S3 (Step 440). The potential of data lines 140*a* and 140*b* are both set to $V_0$ by processor 275, thus turning off both drive transistors 171*a* and 171*c* (Step 445). Current source 240 is set to drive a predetermined test current (Step 450). A current, $I_{testsu}$, thus flows from current source 240 through readout line 141 and EL devices 161*a* and 161*c* to second power supply line 150. The value of current through current source 240 is selected to be less than the maximum current possible through the EL devices; a typical value will be in the range of 1 to 5 microamps per pixel and will be constant for all measurements during the lifetime of the OLED drive circuit. More than one measurement value can be used in this process, e.g. one can choose to do the measurement at 1, 2, and 3 microamps. Voltage measurement circuit 260 is used to test the EL device by measuring the voltage on readout line 141, which is the voltage at the second electrode of readout transistors 186*a* and 186*c*, providing a third readout signal $V_3$ that is representative of characteristics, including the resistance, of the pair of EL devices (Step 455). If there are additional pairs of pixels in the row to be measured (Step 460), multiplexer 295 connected to a plurality of readout lines 141 can be used to permit voltage measurement circuit 260 to sequentially read out the readout signals $V_1$, $V_2$, and $V_3$ for a predetermined number of pixels, e.g. every pair of pixels in the row, and steps 410 to 455 are repeated as necessary. If the display is sufficiently large, it can require a plurality of multiplexers wherein the signals can be provided in a parallel/sequential process. If there are no more pixels to be read in the row, but there are additional rows of circuits to be measured in the display (Step 465), Steps 410 to 460 are repeated for each row. At the end of the process, the characteristics of the transistors and EL devices can be determined, and the necessary changes for each pixel can be calculated (Step 470), which will now be described.

Transistors such as drive transistor 171*a* have a characteristic threshold voltage ($V_{th}$). The voltage on the gate electrode of drive transistor 171*a* must be greater than the threshold voltage to enable current flow between the first and second electrodes. When drive transistor 171*a* is an amorphous silicon transistor, the threshold voltage is known to change under aging conditions. Such conditions include placing drive transistor 171*a* under actual usage conditions, thereby leading to an increase in the threshold voltage. Therefore, a constant signal on the gate electrode can cause a gradually decreasing light intensity emitted by EL device 161*a*. The amount of such decrease will depend upon the use of drive transistor 171*a*; thus, the decrease can be different for different drive transistors in a display, herein termed spatial variations in characteristics of display 200. Such spatial variations can include differences in brightness and color balance in different parts of the display, and image "burn-in" wherein an often-displayed image (e.g. a network logo) can cause a ghost of itself to always show on the active display. It is desirable to compensate for such changes in the threshold voltage to prevent such problems. Also, there can be age-related changes to EL device 161*a*, e.g. luminance efficiency loss and an increase in resistance across EL device 161*a*.

For the first readout signal, the voltages of the components in the circuit can be related by:

$$V_1 = V_{data} - V_{gs(Itestsk)} - V_{read} \quad \text{(Eq. 1)}$$

where $V_{gs(Itestsk)}$ is the gate-to-source voltage that must be applied to drive transistor 171*a* such that its drain-to-source current, $I_{ds}$, is equal to $I_{testsk}$. The values of these voltages will cause the voltage at the second electrode of readout transistor 186*a*, that is, the electrode connected to readout line 141, to adjust to fulfill Eq. 1. Under the conditions described above, $V_{data}$ is a set value and $V_{read}$ (the voltage change across readout transistor 186*a*) can be assumed to be constant. $V_{gs}$ will be controlled by the value of the current set by current sink 245 and the current-voltage characteristics of drive transistor 171*a*, and will change with age-related changes in the threshold voltage of the drive transistor. To determine the change in the threshold voltage of drive transistor 171*a*, two separate test measurements are performed. The first measurement is performed when drive transistor 171*a* is not degraded by aging, e.g. before display 200 is used for display purposes, to cause the voltage $V_1$ to be at a first level, which is measured and stored. Since this is with zero aging, it can be the ideal first signal value, and will be termed the first target signal. After drive transistor 171*a* has aged, e.g. by displaying images for a predetermined time, the measurement is repeated and stored. The stored results can be compared. Changes to the threshold voltage of drive transistor 171*a* will cause a change to $V_{gs}$ to maintain the current. These changes will be reflected in changes to $V_1$ in Eq. 1, so as to produce voltage $V_1$ at a second level, which can be measured and stored. Changes in the corresponding stored signals can be compared to calculate a change in the readout voltage $V_1$, which is related to the changes in drive transistor 171*a* as follows:

$$\Delta V_1 = -\Delta V_{gs} = -\Delta V_{th} \quad \text{(Eq. 2)}$$

Thus, a value of $-\Delta V_1$ can be derived for a correction signal for pixel 205*a* based on the characteristics of drive transistor 171*a* of that pixel.

The second readout signal $V_2$ can be analyzed similarly.

For the third readout signal, the voltages of the components in the circuit can be related by:

$$V_3=CV+V_{EL}+V_{read} \quad \text{(Eq. 3)}$$

where $V_{EL}$ is the potential loss across EL devices 161*a* and 161*c*. The values of these voltages will cause the voltage at the second electrode of readout transistors 186*a* and 186*c* to adjust to fulfill Eq. 3. Under the conditions described above, CV is a set value (the voltage of second power supply line 150) and $V_{read}$ can be assumed to be constant. $V_{EL}$ will be controlled by the value of current set by current source 240 and the current-voltage characteristics of EL devices 161*a* and 161*c*. $V_{EL}$ can change with age-related changes in the EL devices. Because the change in $V_{EL}$ is the result of changes in two pixels, it is important that the EL devices of the pixels undergo similar aging. The pixels can undergo similar aging if 1) the two pixels are adjacent in the same color plane, and 2) the location of the image is changed over time, as will be described below. "Adjacent" for a color display means "adjacent, discounting intervening columns or rows of different colors" according to common practice in the color image processing art. To determine the change in $V_{EL}$, two separate test measurements are performed. The first measurement is performed when the EL devices are not degraded by aging, e.g. before display 200 is used for display purposes, to cause the voltage $V_3$ to be at a first level, which is measured and stored. Since this is with zero aging, it can be the ideal third signal value, and will be termed the third target signal. After EL devices have aged, e.g. by displaying images for a predetermined time, the measurement is repeated and stored. The stored results can be compared. Changes in EL devices 161*a* and 161*c* can cause changes to $V_{EL}$ to maintain the current. These changes will be reflected in changes to $V_3$ in Eq. 3, so as to produce voltage $V_3$ at a second level, which can be measured and stored. Changes in the corresponding stored signals can be compared to calculate a change in the readout voltage, which is related to the changes in EL devices 161*a* and 161*c* as follows:

$$\Delta V_3=\Delta V_{EL} \quad \text{(Eq. 4)}$$

Thus, a value of $\Delta V_3$ can be derived for a correction signal for pixels 205*a* and 205*c* based on the resistance characteristic of the EL devices of those pixels.

The changes in the first, second, and third signals can then be used to compensate for changes in characteristics of pixels 205*a* and 205*c* (Step 470). For compensating for the change in current, it is necessary to make a correction for $\Delta V_{th}$ (related to $\Delta V_1$ or $\Delta V_2$) and $\Delta V_{EL}$ (related to $\Delta V_3$). However, a third factor also affects the luminance of the EL device and changes with age or use: the efficiency of the EL device decreases, which decreases the light emitted at a given current, as described by Levey et al. in abovecited commonly assigned U.S. patent application Ser. No. 11/766,823, the disclosure of which is incorporated herein by reference. In addition to the relations above, Levey et al. described a relationship between the decrease in luminance efficiency of an EL device and $\Delta V_{EL}$, that is, where the EL luminance for a given current is a function of the change in $V_{EL}$:

$$\frac{L_{EL}}{I_{EL}}=f(\Delta V_{EL}) \quad \text{(Eq. 5)}$$

By measuring the luminance decrease and its relationship to $\Delta V_{EL}$ with a given current, a change in corrected signal necessary to cause the EL device to output a nominal luminance can be determined. This measurement can be done on a model system and thereafter stored in a lookup table or used as an algorithm.

To compensate for the above changes in characteristics of transistors and EL devices of pixel 205*a*, one can use the changes in the first and third signals in an equation of the form:

$$\Delta V_{data}=f_1(\Delta V_1)+f_2(\Delta V_3)+f_3(\Delta V_3) \quad \text{(Eq. 6)}$$

where $\Delta V_{data}$ is a correction signal used to adjust the drive signal applied to the gate electrode of drive transistor of the specific pixel (e.g. drive transistor 171*a*) so as to maintain the desired luminance, $f_1(\Delta V_1)$ is a correction signal for the change in threshold voltage of drive transistor 171*a*, $f_2(\Delta V_3)$ is a correction signal for the change in resistance of EL device 161*a*, and $f_3(\Delta V_3)$ is a correction signal for the change in efficiency of EL device 161*a*. For example, the EL display can include a controller which can include a lookup table or algorithm to compute an offset voltage for each measured EL device. The correction signal is computed to provide corrections for changes in current due to changes in the threshold voltage of drive transistor 171*a* and aging of EL device 161*a*, as well as providing a current increase to compensate for efficiency loss due to aging of EL device 161*a*, thus providing a complete compensation solution for the measured pixel. These changes can be applied by the controller to correct the light output to the nominal luminance value desired. By controlling the drive signal applied to the EL device, an EL device with a constant luminance output and increased lifetime at a given luminance is achieved. Similarly, one can use the changes in the second and third signals to provide a correction signal for pixel 205*c*. Because this method provides a correction for each measured EL device in a display, it will compensate for spatial variations in the characteristics of a plurality of EL circuits.

This method can also correct for variations in the characteristics of a plurality of EL circuits on a panel before aging. This can be useful, for example, in panels using low-temperature polysilicon (LTPS) transistors, which can have non-uniform threshold voltage and mobility across a panel. At any time, for example when a panel is manufactured, this method can be employed to measure values for $V_1$ of each pixel 205*a* on the display, as described above. Then, a first target signal can be selected or calculated from the $V_1$ measurements. For example, the maximum measured $V_1$ or the average of all $V_1$ values can be selected as the first target signal. This first target signal can then be used as the first level of voltage $V_1$ in Eq. 2, and the actual measured $V_1$ for each pixel can be used as the second level of voltage $V_1$. This permits compensation for variations in the characteristics of drive transistor 171*a* before aging. In the same manner, $V_2$ can be measured for each pixel 205*c* and compensation applied using Eq. 2. $V_3$ can be measured for each EL device pair 161*a* and 161*c* and a selected, maximum or average $V_3$ used as the third target signal. This third target signal can be used as the first level of voltage $V_3$ in Eq. 3, and each individual $V_3$ measurement as the second level of voltage $V_3$, to apply compensation for variations in the characteristics of EL device pairs across the display. In cases where mobility varies across a panel, $V_1$ and $V_2$ can be measured at two different values of $I_{testsk}$ each. This provides two points which can be used to determine both the offset (due to $V_{th}$) and the slope (due to mobility) of the transfer curves of drive transistors 171*a* and 171*c* respectively.

Figure 5:
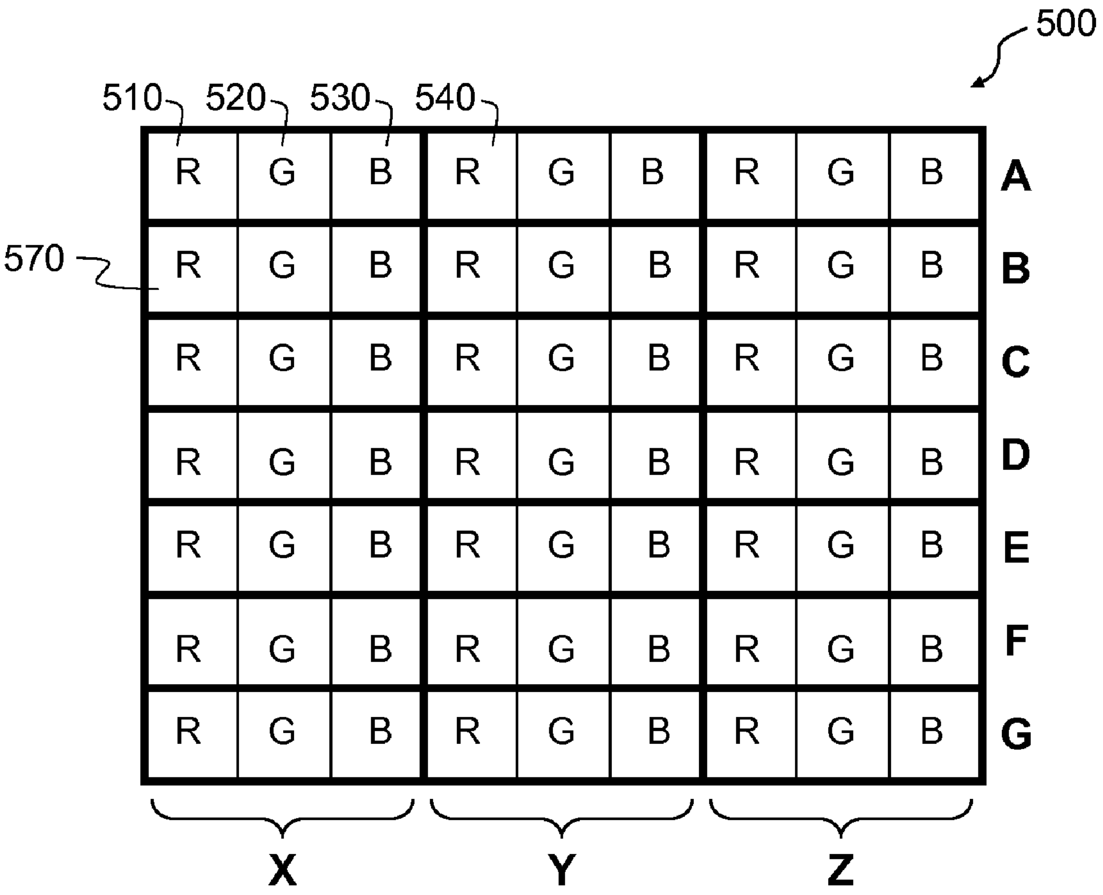
FIG. 5 is a plan view of a portion of one embodiment of an EL display that can be used in the practice of the present invention.

Turning now to FIG. 5, there is shown a plan view of a portion of one embodiment of an EL display that can be used in the practice of the present invention. EL display 500 includes a two-dimensional array of pixels arranged in rows and columns wherein each pixel has an EL device and a drive circuit as described herein, and wherein the EL devices can emit light of different colors, e.g. red, green, and blue. This can be achieved by providing different colored emitters, or alternately by providing broadband, e.g. white, emitters coupled with color filters as known in the art. Each EL device is driven by the corresponding drive circuit in response to a drive signal, as described above, to provide an image on EL display 500. Pixel groups are indicated by the heavier lines. Three pixels, indicated by lighter lines, form each pixel group. The pixel groups will be referred to in this discussion ay a row identifier (A to G) and a column identifier (X to Z). For example, red pixel 510, green pixel 520, and blue pixel 530 include pixel group AX. Thus, each pixel group provides a unit capable of displaying a wide range of colors. Adjacent pixels of the same color are paired as described in FIG. 3. For example, in one embodiment, red pixel 510 can be paired with red pixel 540. In another embodiment, red pixel 510 can be paired with red pixel 570. Similarly, each green and blue pixel will be paired with an adjacent pixel of the same color. For the remainder of his discussion, it will be considered that pixel 510 is paired with pixel 540.

To correct for aging, a correction signal can be derived based on the characteristics of the transistors in a drive circuit, or the EL device, or both, as described above. However, a correction signal for only a pair of EL devices is determined this way. This correction signal can be used to correct for burn-in by adjusting the drive signals applied to the first pixel and one or more adjacent second pixels. Because different colored pixels can be utilized differently and thus have different aging characteristics, it is desirable that the adjustment be determined and performed on adjacent pixels in the same color plane. For example, the correction signal for red pixel 510 can include a correction for aging of the drive transistor of pixel 510, and a correction for the aging of the EL devices in pixels 510 and 540. Similarly, the correction signal for red pixel 540 can include a correction for aging of the drive transistor of pixel 540, and a correction for the aging of the EL devices in pixels 510 and 540.

Some images create burn-in patterns with sharp edges when displayed for long periods of time. For example, letterboxing, as described above, creates two sharp horizontal edges between the 16:9 image area and the matte areas. As a result, it is desirable for the correction signals to have a sharp transition at these boundaries to provide an appropriate compensation. It can therefore be advantageous to apply edge detection algorithms as known in the art to the correction signals of a plurality of the pixels of one or more color planes of the display to determine the location of these sharp transition boundaries for pixels for which the compensation is only measured as part of a pair of pixels. These algorithms can be employed to determine the presence of sharp transitions. A sharp transition of the correction signals is a significant difference in values of the correction signals between adjacent pixels, or between pixels within a defined distance of each other. A significant change can be a difference between correction signal values of at least 20%, or a difference of at least 20% of the average of a group of neighboring values. Sharp transitions can follow lines, e.g. along horizontal, vertical or diagonal dimensions. In such a linear sharp transition, any pixel will have a significant difference in correction signal value compared to an adjacent pixel on the opposite side of the sharp transition. For example, a sharp transition between two adjacent columns is characterized by a significant difference between each pixel in one column and an adjacent pixel of the same color plane in the same row.

The location of a sharp transition can be determined using EL correction signals from neighboring pixels in the same color plane or from drive transistor correction signals for the associated EL devices. If such a transition is found to occur, EL correction signals from pixels on the same side of the transition as evidenced by drive transistor corrections can be given higher weight than correction signals from first pixels on the opposite side of the transition as the second pixel. This can improve image quality in displays with sharp-edged burn-in patterns with no extra hardware cost. Specifically, this method can be applied by locating one or more sharp transitions in the correction signals over the two-dimensional EL pixel array using edge-detection algorithms as known in the art; and, for each sharp transition, using the correction signal for a first pixel to adjust the drive signals applied to the first pixel and one or more adjacent second pixels on the same side of the sharp transition. It can be desirable to combine this analysis of burn-in edges, represented by sharp transitions in the correction signals, with an analysis of image content to determine how to apply correction signals to second pixels, as described by White et al., in above cited commonly assigned U.S. patent application Ser. No. 11/946,392 the disclosure of which is incorporated herein by reference.

This method for compensating for changes in an EL display can be combined with changing the location of the image over time. For example, in the EL display shown in FIG. 5, the image can initially be positioned so that it originates at pixel group AX, that is, so that its upper-left corner is at pixel 510. After some time has passed, the image can be moved one pixel group to the right so that it originates at pixel group AY. Specifically, the image will be displayed originating at pixel group AX for some time, then there will be a final frame at that position, and the next frame will show the image originating at pixel group AY. Viewers generally cannot see such movement in between frames unless the movement amount is very large. After the image has been moved, at a later time, the image can be moved back to originate at pixel group AX. In this way, pixel groups AX and AY will be driven with the same average data over time, and so will age approximately the same. This makes determining a combined EL device compensation, e.g. for pixels 510 and 540, more effective. In order to improve the accuracy of averaging, therefore, the movement of the image can be confined to the space covered by an averaging operation. Additionally, various movement patterns have been taught, for example in U.S. Patent Application Publication No. 2005/0204313 A1.

As discussed above, the prior art teaches various methods for determining when to change the location of the image. However, in an EL display, repositioning can be visible while a still image is shown due to the fast subpixel response time of an EL display compared to e.g. an LCD display. Further, changes at predetermined intervals can become visible over time as the human eye is optimized to detect regularity in anything it sees. Finally, in a television application, the display can be active for hours or days at a time, so repositioning the image at display startup can be insufficient to prevent burn-in.

It can be advantageous, therefore, to reposition the image as often as possible without the movement becoming visible to the user. The location of the image can advantageously be changed after a frame of all-black data signals, or more generally after a frame that has a maximum data signal at or below a predetermined threshold. The predetermined threshold can be a data signal representing black. For example, during TV viewing, the image can be repositioned between two of the several black frames between commercials. The data signals for different color planes can have the same or different predetermined thresholds. For example, since the eye is more sensitive to green light than to red or blue, the threshold for green can be lower than the threshold for red or blue. In this case, the location of the image can be changed after a frame that has a maximum data signal in each color plane at or below the selected threshold for that color plane. That is, if a data signal in any color plane is above the selected threshold for that color plane, the location of the image can be left unchanged to avoid visible motion.

Additionally, the location of the image can be changed at least once per hour. The location of the image can be changed during fast motion scenes, which can be identified by image analysis as known in the art (e.g. motion estimation techniques). The times between successive changes of the image location can be different.

The invention has been described in detail with particular reference to certain preferred embodiments thereof, but it will be understood that variations and modifications can be effected within the spirit and scope of the invention.

Parts List

20 EL display
21 source driver
23 gate driver
25 EL pixel matrix
100 EL pixel
105 EL drive circuit
110 first power supply line
111 first voltage source
120 data line
121*a* data line
121*b* data line
121*c* data line
121*d* data line
125 readout line
126*a* readout line
126*b* readout line
126*c* readout line
126*d* readout line
130 select line
131*a* select line
131*b* select line
131*c* select line
135*a* select line
135*b* select line
140*a* data line
140*b* data line
141 readout line
145 first electrode
150 second power supply line
151 second voltage source
155 second electrode
160 EL device
161*a* EL device
161*c* EL device
165 gate electrode
170 drive transistor
171*a* drive transistor
171*c* drive transistor
180 switch transistor
181*a* switch transistor
185 readout transistor
186*a* readout transistor
186*c* readout transistor
190 capacitor
191*a* capacitor
195 electronics
200 EL display
205*a* pixel
205*b* pixel
205*c* pixel
205*d* pixel
210 first switch
220 second switch
225 control bus
230 switch block
240 current source
245 current sink
260 voltage measurement circuit
265 low-pass filter
270 analog-to-digital converter
275 processor
280 memory
285 data input
290 digital-to-analog converter
295 multiplexer
410 block
415 block
420 block
425 block
430 block
435 block
440 block
445 block
450 block
455 block
460 decision block
465 decision block
470 block
500 EL display
510 pixel
520 pixel
530 pixel
540 pixel
570 pixel

The invention claimed is:

1. A method of determining characteristics of transistors and electroluminescent devices in an electroluminescent display, comprising:

(a) providing an electroluminescent display having a two-dimensional array of electroluminescent devices arranged in rows and columns, wherein each electroluminescent device is driven by a drive circuit in response to a drive signal;

(b) providing for pairs of electroluminescent devices a first drive circuit associated with the first electroluminescent device, a second drive circuit associated with the second electroluminescent device, and a single readout line, each drive circuit including a drive transistor having first, second, and gate electrodes, and a readout transistor having first, second, and gate electrodes, with each readout transistor of a pair being electrically connected to the readout line;

(c) providing a first voltage source and a first switch for selectively connecting the first voltage source to the first electrodes of the drive transistors;

(d) providing a second voltage source and a second switch for selectively connecting the electroluminescent devices to the second voltage source;

(e) providing a current source and a third switch for selectively connecting the current source to the second electrode of the readout transistors;

(f) providing a current sink and a fourth switch for selectively connecting the current sink to the second electrode of the readout transistors;

(g) providing a test voltage source for turning the drive transistors on and off by applying potential to the gate electrodes of the drive transistors;

(h) providing a voltage measurement circuit connected to the second electrode of the readout transistors;

(i) sequentially testing the drive transistors of the first and second drive circuits by closing the first and fourth switches, opening the second and third switches, using the test voltage source to turn on the drive transistor of the first drive circuit and turn off the drive transistor of the second drive circuit, drawing a test current using the current sink, using the voltage measurement circuit to measure the voltage at the second electrode of the readout transistor of the first drive circuit to provide a first signal representative of characteristics of the drive transistor of the first drive circuit using the test voltage source to turn off the drive transistor of the first drive circuit and turn on the drive transistor of the second drive circuit, and using the voltage measurement circuit to measure the voltage at the second electrode of the readout transistor of the second drive circuit to provide a second signal representative of characteristics of the drive transistor of the second drive circuit, whereby the characteristics of each drive transistor are determined; and (j) simultaneously testing the first and second electroluminescent devices by opening the first and fourth switches, and closing the second and third switches, using the test voltage source to turn off both of the drive transistors, driving a test current using the current source, and using the voltage measurement circuit to measure the voltage at the second electrode of the readout transistors to provide a third signal representative of characteristics of the pair of electroluminescent devices, whereby the characteristics of both electroluminescent devices are determined.

2. The method of claim 1, wherein the transistors are amorphous-silicon thin-film transistors.

3. The method of claim 1, wherein electroluminescent devices are OLED devices.

4. The method of claim 1, wherein the second electrode of each drive transistor is connected to the corresponding electroluminescent device and to the first electrode of the corresponding readout transistor.

5. The method of claim 1, wherein the gate electrodes of the readout transistors in a pair of electroluminescent devices are connected together.

6. The method of claim 1, wherein the display includes electroluminescent devices emitting light of different colors, and wherein each electroluminescent device in a pair emits light of the same color.

7. A method of determining characteristics of transistors and electroluminescent devices in an electroluminescent display, comprising:

(a) providing the electroluminescent display having a two-dimensional array of pixels arranged in rows and columns, each pixel including an electroluminescent device, wherein each electroluminescent device is driven by a drive circuit in response to a respective drive signal to emit light at a brightness corresponding to the respective drive signal;

(b) selecting a first pixel and a first plurality of pixels including the first pixel to provide an image originating at the first pixel using the first plurality of pixels;

(c) providing for pairs of electroluminescent devices a first drive circuit associated with the first electroluminescent device, a second drive circuit associated with the second electroluminescent device, and a single readout line, each drive circuit including a drive transistor having first, second, and gate electrodes, and a readout transistor having first, second, and gate electrodes, with each readout transistor of a pair being electrically connected to the readout line;

(d) providing a first voltage source and a first switch for selectively connecting the first voltage source to the first electrodes of the drive transistors;

(e) providing a second voltage source and a second switch for selectively connecting the electroluminescent devices to the second voltage source;

(f) providing a current source and a third switch for selectively connecting the current source to the second electrode of the readout transistors;

(g) providing a current sink and a fourth switch for selectively connecting the current sink to the second electrode of the readout transistors;

(h) providing a test voltage source for turning the drive transistors on and off by applying potential to the gate electrodes of the drive transistors;

(i) providing a voltage measurement circuit connected to the second electrode of the readout transistors;

(j) sequentially testing the drive transistors of the first and second drive circuits by closing the first and fourth switches, opening the second and third switches, using the test voltage source to turn on the drive transistor of the first drive circuit and turn off the drive transistor of the second drive circuit, drawing a test current using the current sink, using the voltage measurement circuit to measure the voltage at the second electrode of the readout transistor of the first drive circuit to provide a first signal representative of characteristics of the drive transistor of the first drive circuit, using the test voltage source to turn off the drive transistor of the first drive circuit and turn on the drive transistor of the second drive circuit, and using the voltage measurement circuit to measure the voltage at the second electrode of the readout transistor of the second drive circuit to provide a second signal representative of characteristics of the drive transistor of the second drive circuit, whereby the characteristics of each drive transistor are determined;

(k) simultaneously testing the first and second electroluminescent devices by opening the first and fourth switches, and closing the second and third switches, using the test voltage source to turn off both of the drive transistors, driving a test current using the current source, and using the voltage measurement circuit to measure the voltage at the second electrode of the readout transistors to provide a third signal representative of characteristics of the pair of electroluminescent devices, whereby the characteristics of both electroluminescent devices are determined;

(l) selecting a second pixel and a second plurality of pixels including the second pixel to provide the image originating at the second pixel using the second plurality of pixels; and (m) repeating step (l) to change the location of the image over time.

8. The method of claim 7, wherein the transistors are amorphous-silicon thin-film transistors.

9. The method of claim 7, wherein electroluminescent devices are OLED devices.

10. The method of claim 7, wherein the second electrode of each drive transistor is connected to the corresponding electroluminescent device and to the first electrode of the corresponding readout transistor.

11. The method of claim 7, wherein the gate electrodes of the readout transistors in a pair of electroluminescent devices are connected together.

12. The method of claim 7, wherein the display includes electroluminescent devices emitting light of different colors, and wherein each electroluminescent device in a pair emits light of the same color.

13. The method of claim 7, further comprising changing the location of the image after a frame that has a maximum data signal at or below a predetermined threshold.

14. The method of claim 13, wherein the predetermined threshold is a data signal representing black.

15. The method of claim 13, wherein the display includes electroluminescent devices emitting light of different colors, and wherein each color has a predetermined threshold.

16. The method of claim 7, further comprising changing the location of the image at least once per hour.

17. The method of claim 7, further comprising changing the location of the image during fast motion scenes.

18. An electroluminescent display comprising (a) a two-dimensional array of pixel pairs arranged in rows and columns, the first pixel of the pair having a first drive circuit and a first electroluminescent device in association, and the second pixel of the pair having a second drive circuit and a second electroluminescent device in association, each drive circuit including a drive transistor having first, second, and gate electrodes, and a readout transistor having first, second, and gate electrodes, and including a single readout line for the pixel pair to which each readout transistor in the pair is electrically connected;

(b) a first voltage source and a first switch for selectively connecting the first voltage source to the first electrodes of the drive transistors;

(c) a second voltage source and a second switch for selectively connecting the electroluminescent devices to the second voltage source;

(d) a current source and a third switch for selectively connecting the current source to the second electrode of the readout transistors;

(e) a current sink and a fourth switch for selectively connecting the current sink to the second electrode of the readout transistors;

(f) a test voltage source for turning the drive transistors on and off by applying potential to the gate electrodes of the drive transistors;

(g) a voltage measurement circuit connected to the second electrode of the readout transistors; and (h) a controller for sequentially testing each drive transistor of the pixel pair and for simultaneously testing the first and second electroluminescent devices.

19. The electroluminescent display of claim 18, wherein the controller sequentially tests the drive transistors of the pixel pair by closing the first and fourth switches, opening the second and third switches, using the test voltage source to turn on the drive transistor of the first pixel and turn off the drive transistor of the second pixel, drawing a test current using the current sink, using the voltage measurement circuit to measure the voltage at the second electrode of the readout transistor of the first pixel to provide a first signal representative of characteristics of the drive transistor of the first pixel, using the test voltage source to turn off the drive transistor of the first pixel and turn on the drive transistor of the second pixel, and using the voltage measurement circuit to measure the voltage at the second electrode of the readout transistor of the second pixel to provide a second signal representative of characteristics of the drive transistor of the second pixel, whereby the characteristics of each drive transistor are determined;

and wherein the controller simultaneously tests the first and second electroluminescent devices by opening the first and fourth switches, and closing the second and third switches, using the test voltage source to turn off both of the drive transistors, driving a test current using the current source, and using the voltage measurement circuit to measure the voltage at the second electrode of the readout transistors to provide a third signal representative of characteristics of the pair of electroluminescent devices, whereby the characteristics of both electroluminescent devices are determined.

20. The electroluminescent display of claim 18, wherein the second electrode of each drive transistor is connected to the corresponding electroluminescent device and to the first electrode of the corresponding readout transistor.

21. The electroluminescent display of claim 18, wherein the gate electrodes of the readout transistors in a pixel pair are connected together.

* * * * *